United States Patent
Aweya et al.

(10) Patent No.: US 7,860,205 B1
(45) Date of Patent: Dec. 28, 2010

(54) CLOCK SYNCHRONIZATION USING A WEIGHTED LEAST SQUARES ERROR FILTERING TECHNIQUE

(75) Inventors: James Aweya, Kanta (CA); Michel Ouellette, Orleans (CA); Delfin Y. Montuno, Kanata (CA); Kent Felske, Kanta (CA)

(73) Assignee: Ciena Corporation, Linthicum, MD (US)

( * ) Notice: Subject to any disclaimer, the term of this patent is extended or adjusted under 35 U.S.C. 154(b) by 1261 days.

(21) Appl. No.: 11/279,410

(22) Filed: Apr. 12, 2006

Related U.S. Application Data

(63) Continuation-in-part of application No. 10/076,415, filed on Feb. 19, 2002, now Pat. No. 7,043,651.

(60) Provisional application No. 60/732,276, filed on Nov. 1, 2005, provisional application No. 60/323,125, filed on Sep. 18, 2001.

(51) Int. Cl.
*H03D 3/24* (2006.01)

(52) U.S. Cl. ............... 375/376; 375/371; 375/147; 375/324; 375/327; 375/356; 713/400; 370/497

(58) Field of Classification Search ............ 375/327, 375/343, 376, 371, 147, 324; 713/400; 370/497
See application file for complete search history.

(56) References Cited

U.S. PATENT DOCUMENTS

| | | | | |
|---|---|---|---|---|
| 4,860,321 | A | * | 8/1989 | von der Embse ............ 375/343 |
| 5,909,470 | A | * | 6/1999 | Barratt et al. ............... 375/324 |
| 6,650,719 | B1 | * | 11/2003 | Baker .......................... 375/371 |
| 7,130,368 | B1 | * | 10/2006 | Aweya et al. ............... 375/376 |
| 7,289,538 | B1 | * | 10/2007 | Paradise et al. ............. 370/497 |
| 2003/0056136 | A1 | * | 3/2003 | Aweya et al. ............... 713/400 |
| 2004/0228390 | A1 | * | 11/2004 | Sommer et al. ............. 375/147 |
| 2007/0076822 | A1 | * | 4/2007 | Miller et al. ................ 375/327 |

* cited by examiner

*Primary Examiner*—Sudhanshu C Pathak
(74) *Attorney, Agent, or Firm*—Christopher & Weisberg, P.A.

(57) ABSTRACT

A timestamp-based clock synchronization technique is employed for CES in packet networks. The technique is based on a double exponential filtering technique and a linear process model. The linear process model is used to describe the behavior of clock synchronization errors between a transmitter and a receiver. The technique is particularly suitable for clock synchronization in networks where the transmitter and receiver are not driven from a common timing reference but the receiver requires timing reference traceable to the transmitter clock.

21 Claims, 17 Drawing Sheets

CLOCK SYNCHRONIZATION USING A WEIGHTED LEAST SQUARES ERROR FILTERING TECHNIQUE

CROSS-REFERENCE TO RELATED APPLICATIONS

This application is a continuation-in-part of U.S. application Ser. No. 10/076,415, filed Feb. 19, 2002 now U.S. Pat. No. 7,043,651, entitled TECHNIQUE FOR SYNCHRONIZING CLOCKS IN A NETWORK, which claims priority to U.S. provisional application 60/323,125, filed Sep. 18, 2001. A claim of priority is also made to U.S. provisional patent application Ser. No. 60/732,276, entitled TECHNIQUE FOR DIFFERENTIAL CLOCK RECOVERY IN PACKET NETWORKS, filed Nov. 1, 2005, which is incorporated by reference.

FIELD OF THE INVENTION

This invention relates generally to the field of network communications, and more particularly to clock synchronization for Circuit Emulation Service.

BACKGROUND OF THE INVENTION

Circuit Emulation Service ("CES") allows time division multiplexing ("TDM") services such as DS-n and E-n circuits to be transparently extended across a packet network. With circuit emulation over IP, for example, TDM data received from an external device at the edge of an Internet Protocol ("IP") network is converted to IP packets, sent through the IP network, passed out of the IP network to its destination, and reassembled into a TDM bit stream. One application of CES is the interconnection of enterprise private telephone networks at different sites. For example, CES over a packet network can be used to connect two private branch exchanges ("PBXs") on two different campuses without having packet transport capabilities on the PBXs themselves. This interworking allows voice traffic between the two campuses to use a packet network backbone instead of leased TDM lines, and also allows voice and data traffic to use the same packet network.

In order for CES to function properly it is desirable to achieve the same clock in both the transmitting and receiving ends of a TDM circuit from end-to-end such that, for example, the T1 stream of a downstream PBX transmits with the same clocking characteristics as the T1 stream of the upstream PBX. Known clocking techniques include both synchronous and asynchronous clocking modes, of which the asynchronous clocking modes include Differential Clock Recovery, Independent Clocking, Clock Recovery using Simple Timestamps, Adaptive Buffer-Fill-based Clock Recovery, and Adaptive Packet Inter-arrival Time Averaging-based Clock Recovery.

In the timestamp-based technique for clock synchronization, a master periodically sends explicit time indications or timestamps to a slave to enable the slave to synchronize its local clock to the transmitter's clock. This synchronization strategy allows multiple slaves, for example in a broadcast or point-to-multipoint communication scenario, to synchronize their clocks to the master. The master clock could consist essentially of an oscillator and a pulse counter. The oscillator issues periodic pulses that constitute the input to the pulse (timestamp) counter. The output of the counter represents the master clock signal and is incremented by a fixed amount at each pulse. Samples of master clock signals are communicated to the slave as timestamps. A receiving TDM terminal node employs an adaptive timing technique to reconstruct the timing signal of the transmitting TDM terminal from the timestamps. This is commonly done using a PLL that slaves the receiver clock to a transmitter clock. The PLL is able to process transmitted timestamps to generate timing signal for the receiver. The purpose of the PLL is to estimate and compensate for the frequency drift occurring between the oscillators of the transmitter clock and the receiver clock. It would be desirable to enhance performance of the PLL.

SUMMARY OF THE INVENTION

In accordance with one embodiment of the invention, apparatus for synchronizing a local clock at a receiver with a local clock at a transmitter, where indications of transmitter clock signals are communicated to the receiver as timestamps, comprises: a phase detector operable to compute an error signal indicative of differences between the timestamps and a local clock signal; a loop filter operable to estimate a frequency offset of the receiver clock with respect to the transmitter clock by weighted least-squares calculation, and thereby produce a control signal; an oscillator operable to oscillate at a frequency based at least in-part on the control signal, and thereby produce a digital oscillator output signal; and a counter operable to count pulses in the digital oscillator output signal, and output the local clock signal.

In accordance with another embodiment of the invention, a method for synchronizing a local clock at a receiver with a clock at a transmitter, where indications of transmitter clock signals are communicated to the receiver as timestamps, comprises the steps of: computing, with a phase detector, an error signal indicative of differences between the timestamps and a local clock signal; estimating, with a loop filter, a frequency offset of the receiver clock with respect to the transmitter clock by weighted least-squares calculation, thereby producing a control signal; producing a digital oscillator output signal with a digital oscillator operable to oscillate at a frequency based at least in-part on the control signal; and counting pulses in the digital oscillator output signal with a timestamp counter, thereby producing the local clock signal.

The weighted least-squares technique advantageously enhances PLL efficiency. In particular, the technique reduces the requisite number of clock samples to generate accurate timing signals in comparison with least-square linear regression.

DETAILED DESCRIPTION

Figure 1:
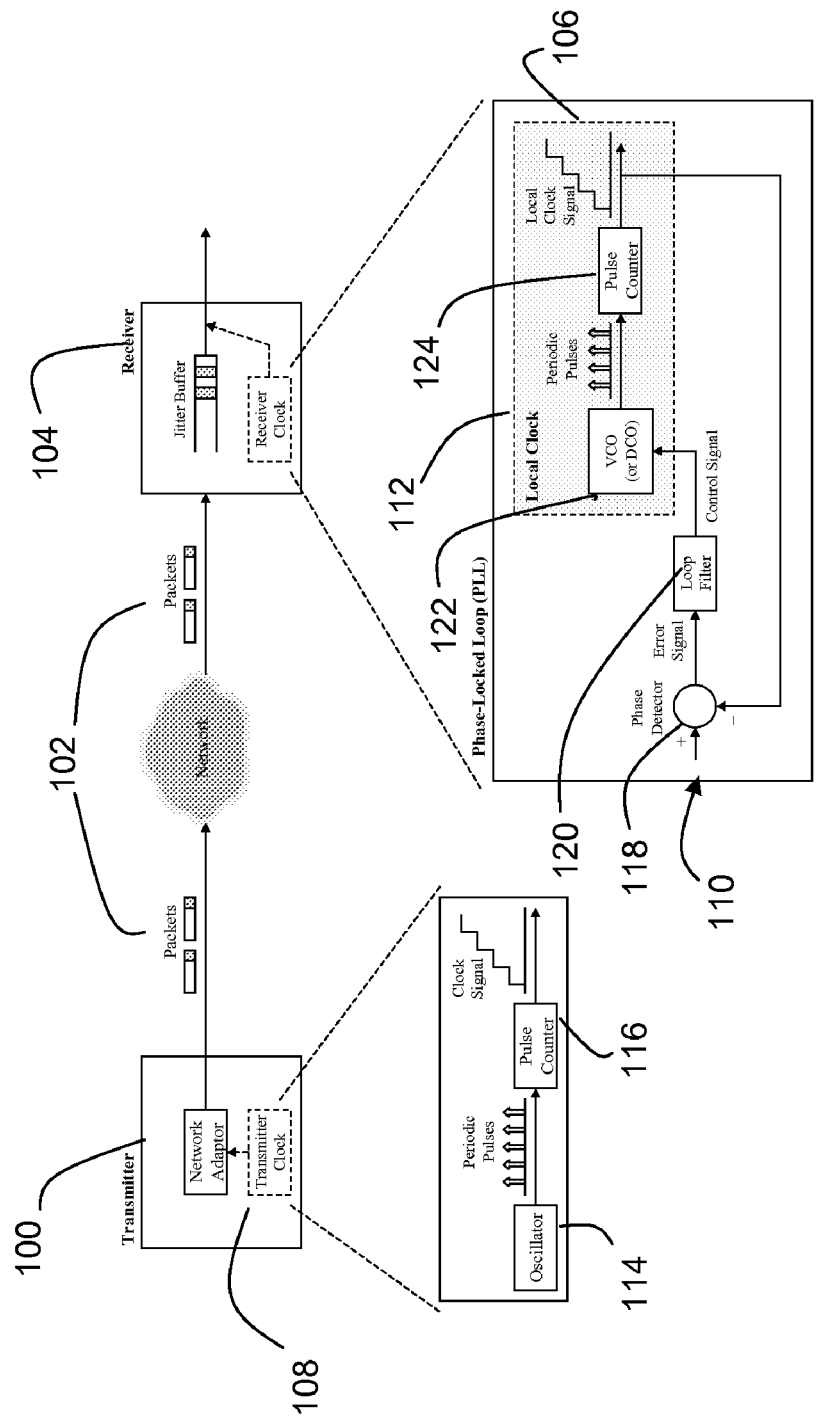
FIG. 1 is a block diagram of a clock synchronization technique based on Double Exponential Filtering.

A high-level view of clock synchronization based on timestamps is shown in FIG. 1. The transmitter (100) sends an explicit time indication or timestamp (102) (in packets, with or without user data) to the receiver (104) so that the receiver can synchronize its local clock (106) to the transmitter clock (108). Since no common network clock is available, the receiver (104) relies on locking the recovered clock to the arrival of the timestamp patterns. In particular, the synchronizing patterns are detected and used at the receiver to generate a reference signal (110) for a phase-locked loop ("PLL") (112). In this manner multiple receivers, for example in a broadcast or point-to-multipoint communication scenario, are able to synchronize their clocks to the transmitter (100).

The timestamp-based clock synchronization technique may be implemented in a variety of ways. In the illustrated embodiment, for example, the transmitter clock (108) includes an oscillator (114) and a pulse counter (116). The oscillator issues periodic pulses that constitute the input to the pulse counter. The oscillator frequency is the inverse of the interval between consecutive pulses (oscillator period). The output of the counter represents the transmitter clock signal and is incremented by a fixed amount at each pulse. Samples of transmitter clock signals are communicated to the receiver as timestamps (102). The PLL (112) at the receiver uses the timestamps (which constitute the PLL reference signal) to lock onto the transmitter clock.

The illustrated PLL (112) has four main components: a phase detector (118), a loop filter (120), an oscillator (122) such as a voltage controlled oscillator ("VCO") or digitally controlled oscillator ("DCO"), and a pulse counter (124). The phase detector computes an error signal as the difference between the reference signal and the output signal of the PLL. The error signal is passed on to the loop filter which is operative to reduce jitter and noise in the input signal. The VCO (or DCO), which typically has a center frequency, oscillates at a frequency which is determined by the output signal of the loop filter.

Figure 2:
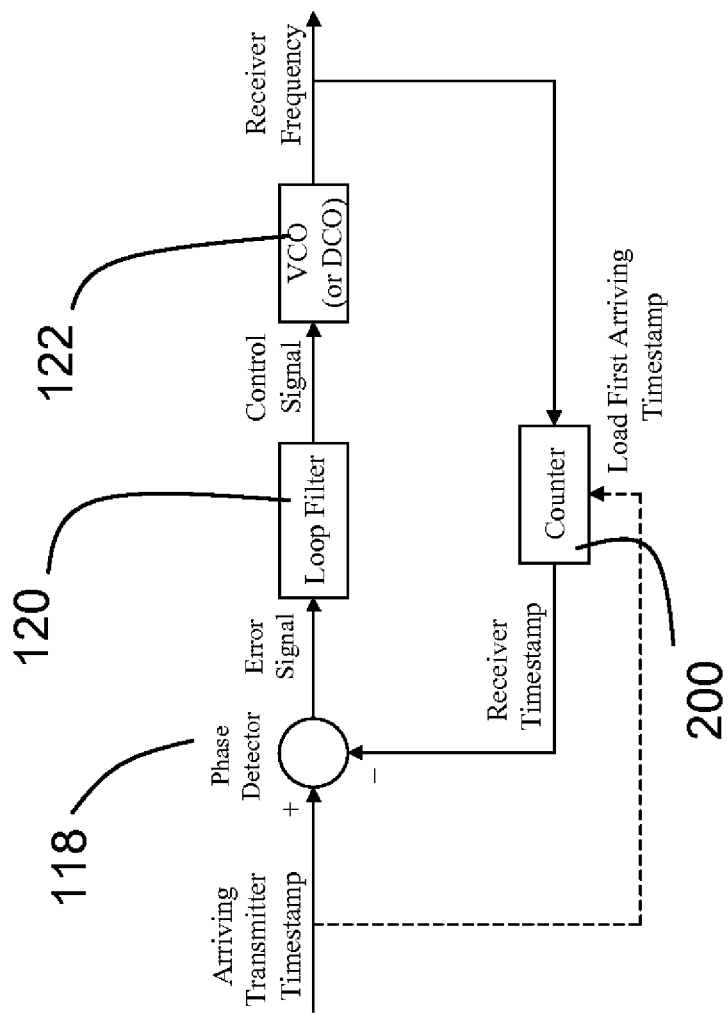
FIG. 2 illustrates the PLL at the receiver in greater detail.

A high-level implementation of the PLL (112) at the receiver is shown in FIG. 2. Initially, the PLL waits for the first timestamp to arrive. When the first timestamp arrives it is loaded into a counter (200), following which the PLL operates in a closed-loop fashion. Each time a timestamp arrives it is compared to the current value in the counter and the difference is computed as an error term by phase detector (118). This error term is sent to the loop filter (120) (an estimation mechanism) whose output controls the frequency of the VCO (or DCO) (122). The output of the VCO (or DCO) in turn provides the clock frequency of the receiver and also drives the counter (200). Eventually, the error term is expected to converge to zero, which means the PLL has been locked to the incoming time base, i.e., time base of the transmitter.

Figure 3:
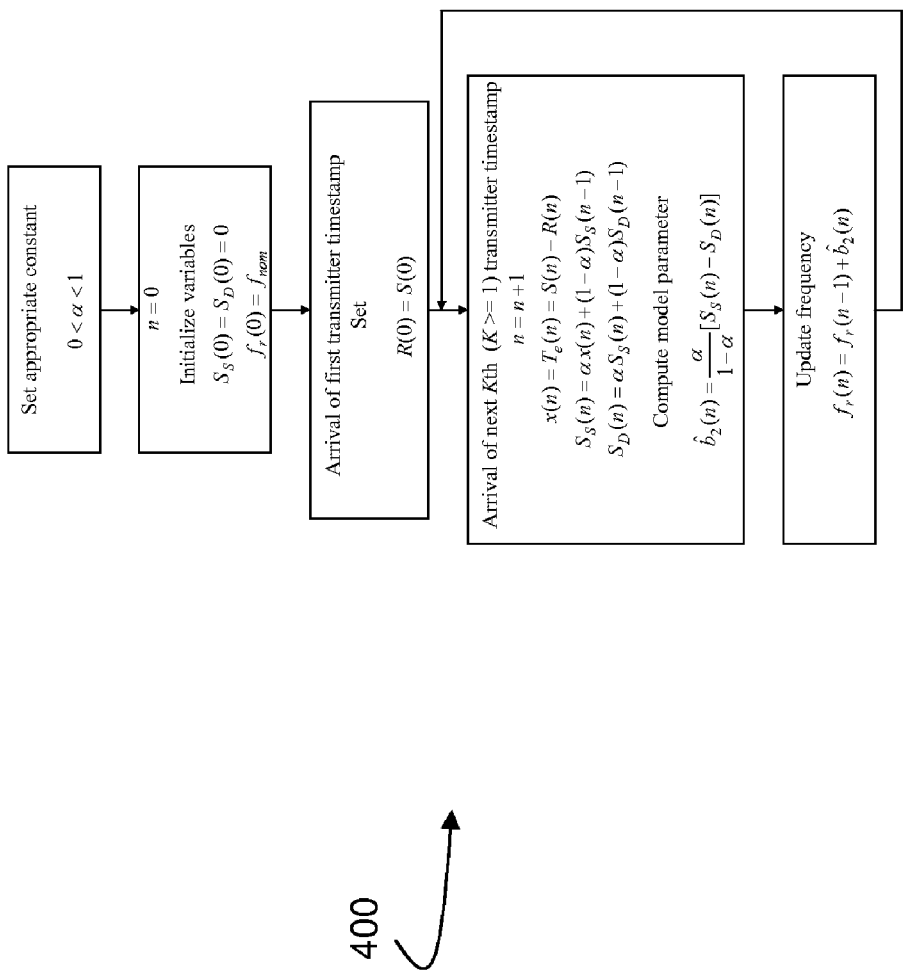
FIG. 3 illustrates the clock synchronization algorithm.
Figure 4:
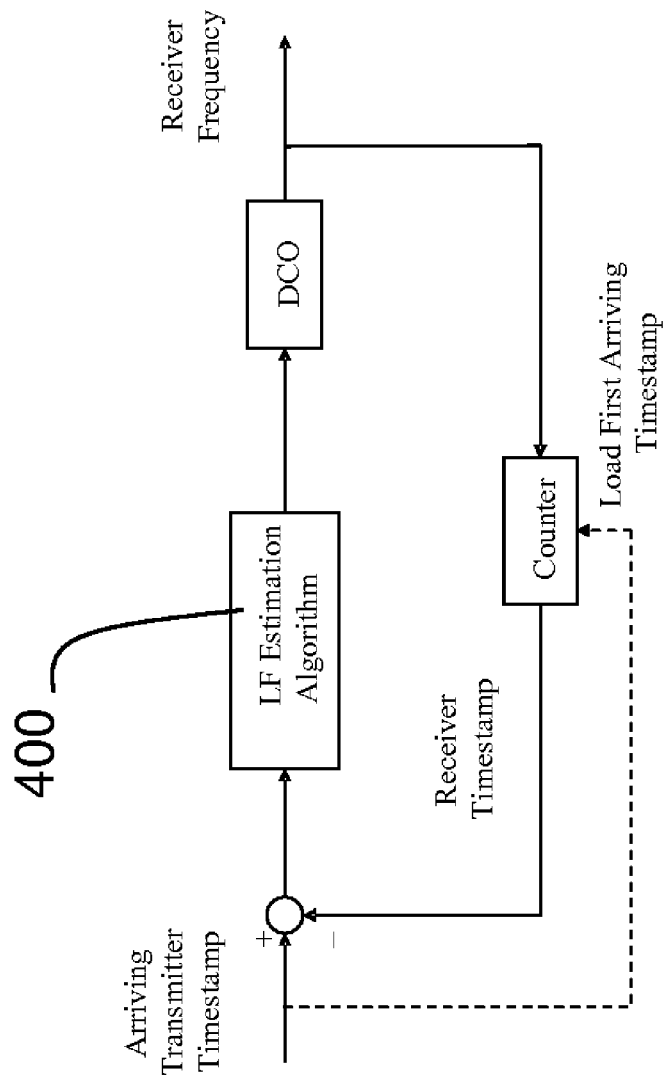
FIG. 4 illustrates a receiver PLL implementation using a DCO.

Referring to FIGS. 3 and 4, an estimation algorithm (400) is implemented by the loop filter to estimate and compensate for the frequency drift occurring between the oscillators of the transmitter clock and the receiver clock. One technical difficulty in designing a clock synchronization technique is that the presence of network delay variation affects the performance of the clock estimation/compensation process, making the transmitter clock appear faster or slower than it actually is, and ultimately, causing the propagation of some residual jitter up to the receiver clock signal. The presence of even a modest amount of delay variation makes the clock recovery problem difficult. In mathematical terms, let $S(i)$ and $R(i)$ denote the time bases of the transmitter and the receiver, respectively, where these two functions correspond to the timestamps of the two clocks at discrete time instant i, where $i=1,2,3,K$, and let $f_s(i)$ and $f_r(i)$ denote the frequencies in cycles per second (Hertz) of the transmitter clock and the receiver clock, respectively. The receiver (PLL) initializes its counter value to the first arriving transmitter timestamp, i.e., $R(0)=S(0)$. When the PLL receives a new timestamp $S(i)$ it is compared with the local timestamp $R(i)$ to generate an error signal $T_e(i)=S(i)-R(i)$. The sequence of observation on the variable $T_e(i)$ forms a time series. The development of many types of systems involves the assumption of a particular mathematical model as the underlying process for the observed data, and then the estimation of the unknown parameters in that model from historical data. Let us assume that the time series on $T_e(i)$ up to the current time period (or sample) n can be modeled by the following linear trend model:

$$x(i)=T_e(i)=b_1+b_2 i+\epsilon(i), i=1,2,K,n, \quad (1)$$

where the expected value of x(i) at time t is a linear function of i.

$E[x(i)|i]=b_1+b_2 i$, $b_1$ is the intercept (or the level at time $i=0$), $b_2$ is the slope $(dT_e(i)/di=b_2)$, and $\epsilon(i)$ is a random component having mean $E[\epsilon(i)]=0$ and variance $Var[\epsilon(i)]=\sigma_\epsilon^2$, and is not serially correlated with random deviations at other times, i.e., $E[\epsilon(i)\epsilon(i+\psi)]=0$ for $\psi\neq 0$. In the clock synchronization problem, $b_1$ represents the fixed time offset between the transmitter and receiver clocks, and $b_2$ the frequency offset of the receiver clock with respect to the transmitter clock, i.e., $b_2=f_s-f_r=\Delta f$. By estimating the frequency offset $\Delta f=\hat{b}_2$ the receiver clock frequency $f_r$ can be modified in order to reduce this offset to zero. At this point the receiver clock frequency $f_r$ will be equal to the transmitter clock frequency $f_s$. If we define $\hat{b}_2(n)$ as the estimate of $b_2$ at the end of the most recent observation (or update) at time period n, then the receiver frequency can be updated as follows:

$$f_r(n)=f_r(n-1)+\hat{b}_2(n). \quad (2)$$

As will now be shown, a weighted (or discounted) least-squares criterion can be used to estimate $b_2$. At time n, we desire to find $\hat{b}_1(n)$ and $\hat{b}_2(n)$ to minimize the weighted sum of squares $$S_{SE}=\sum_{i=1}^{n}\beta^{n-i}[x(i)-b_1-b_2 i]^2, 0<\beta<1. \quad (3)$$

The least-squares equations are obtained from $$\left.\frac{\partial S_{SE}}{\partial b_1}\right|_{\hat{b}_1,\hat{b}_2}=-2\sum_{i=1}^{n}\beta^{n-i}[x(i)-\hat{b}_1(n)-\hat{b}_2(n)i]=0 \quad (4)$$

-continued $$\frac{\partial S_{SE}}{\partial b_1}\bigg|_{\hat{b}_1,\hat{b}_2} = -2\sum_{i=1}^{n}\beta^{n-i}[x(i)-\hat{b}_1(n)-\hat{b}_2(n)i]i = 0 \quad (5)$$

These equations are $$\left(\sum_{i=1}^{n}\beta^{n-i}\right)\hat{b}_1(n)+\left(\sum_{i=1}^{n}\beta^{n-i}i\right)\hat{b}_2(n)=\sum_{i=1}^{n}\beta^{n-i}x(i) \quad (6)$$

$$\left(\sum_{i=1}^{n}\beta^{n-i}i\right)\hat{b}_1(n)+\left(\sum_{i=1}^{n}\beta^{n-i}i^2\right)\hat{b}_2(n)=\sum_{i=1}^{n}\beta^{n-i}ix(i) \quad (7)$$

or $$c_{11}\hat{b}_1(n)+c_{12}\hat{b}_2(n)=\sum_{i=1}^{n}\beta^{n-i}x(i) \quad (8)$$

$$c_{21}\hat{b}_1(n)+c_{22}\hat{b}_2(n)=\sum_{i=1}^{n}\beta^{n-i}ix(i) \quad (9)$$

where the coefficients in closed form are $$c_{11}=\frac{1-\beta^n}{1-\beta} \quad (10)$$

$$c_{12}=c_{21}=\frac{\beta^{n+1}-(n+1)\beta+n}{(1-\beta)^2} \quad (11)$$

$$c_{22}=\frac{(n+1)^2\beta^2-(2n^2+2n-1)\beta-(1+\beta)\beta^{n+1}+n^2}{(1-\beta)^3} \quad (12)$$

When n is large, $\beta^n \approx 0$ and we may use $$c_{11}=\frac{1}{1-\beta}=\frac{1}{\alpha} \quad (13)$$

$$c_{12}=c_{21}=\frac{n-(n+1)\beta}{(1-\beta)^2}=\frac{\alpha n-\beta}{\alpha^2} \quad (14)$$

$$c_{22}=\frac{(n+1)^2\beta^2-(2n^2+2n-1)\beta+n^2}{(1-\beta)^3}= \quad (15)$$

$$\frac{(n+1)^2\beta^2-2(n+1)n\beta+n^2+\beta}{\alpha^3}$$

Having derived closed form expressions for the coefficients $c_{11}$, $c_{12}$, $c_{21}$, and $c_{22}$, next we derive simple closed form expressions for $$\sum_{i=1}^{n}\beta^{n-i}x(i) \text{ and } \sum_{i=1}^{n}\beta^{n-i}ix(i).$$

Proposition 1: If a simple exponential filtering were applied to the observations from the linear process of (1), we would obtain at the end of time n $$S_S(n)=\alpha x(n)+(1-\alpha)S_S(n-1), \quad (16)$$

where $S_S(n)$ is the first-order smoothed statistic and $\alpha$ is the filtering constant. The statistic $S_S(n)$ is a weighted average of all past observations. Then for large n, $$\sum_{i=1}^{n}\beta^{n-i}x(i)=\frac{1}{\alpha}S_S(n) \quad (17)$$

Proof: To show this, we first demonstrate how $S_S(n)$ can be written as a linear combination of past data and then observe that the weights given to past observations are nonnegative and add to 1, thus making it possible to interpret $S_S(n)$ as a weighted average. Substituting for $S_S(n-1)$ in the right-hand side of (16), we obtain $$S_S(n) = \alpha x(n) + (1-\alpha)[\alpha x(n-1) + (1-\alpha)S_S(n-2)]$$
$$= \alpha x(n) + \alpha(1-\alpha)x(n-1) + (1-\alpha)^2 S_S(n-2)$$

Continuing to substitute recursively for $S_S(n-k)$, k=2,3,K, n, we finally obtain $$S_S(n)=\alpha\sum_{k=0}^{n-1}(1-\alpha)^k x(n-k)+(1-\alpha)^n S_S(0), \quad (18)$$

where $S_S(0)$ is the initial estimate used to start the filtering process. The weights sum to unity, since $$\alpha\sum_{k=0}^{n-1}(1-\alpha)^k=\alpha\left[\frac{1-(1-\alpha)^n}{1-(1-\alpha)}\right]=1-(1-\alpha)^n.$$

With the exception of the coefficient of $S_S(0)$, the weights decrease geometrically with the age of the observations. Because these weights appear to decline exponentially when connected by a smooth curve, the name exponential filtering has been applied to this procedure.

Letting $\beta=1-\alpha$ in (18) for convenience, we get $$S_S(n)=\alpha\sum_{i=0}^{n-1}\beta^i x(n-i)+\beta^n S_S(0)=\alpha\sum_{i=1}^{n}\beta^{n-i}x(i)+\beta^n S_S(0) \quad (19)$$

Now for large n, the above expression simplifies to $$\alpha\sum_{i=1}^{n}\beta^{n-i}x(i)=S_s(n) \quad (20)$$

which ends the proof.

Proposition 2: If we apply the double exponential filtering to $S_S(i)$, then we get $$S_D(n)=\alpha S_S(n)+(1-\alpha)S_D(n-1), \quad (21)$$

where $S_D(n)$ is the second-order smoothed statistic and $\alpha$ is the filtering constant. Then for large n, $$\sum_{k=1}^{n} \beta^{n-k} k x(k) = \frac{(n+1)}{\alpha} S_S(n) - \frac{1}{\alpha^2} S_D(n) \quad (22)$$

Proof: The double exponential filtering can be expressed as $$S_D(n) = \alpha \sum_{i=0}^{n-1} \beta^i S_S(n-i) + \beta^n S_D(0) = \alpha \sum_{i=1}^{n} \beta^{n-i} S_S(i) + \beta^n S_D(0) \quad (23)$$

$$= \alpha \sum_{i=1}^{n} \beta^{n-i} \left[ \alpha \sum_{k=1}^{i} \beta^{i-k} x(k) + \beta^i S_S(0) \right] + \beta^n S_D(0)$$

then for large n $$S_D(n) = \alpha^2 \sum_{i=1}^{n} \sum_{k=1}^{i} \beta^{n-k} x(k) = \alpha^2 \sum_{k=1}^{n} (n-k+1) \beta^{n-k} x(k) \quad (24)$$

$$= \alpha^2 \left[ (n+1) \sum_{k=1}^{n} \beta^{n-k} x(k) - \sum_{k=1}^{n} \beta^{n-k} k x(k) \right]$$

$$= \alpha^2 \left[ (n+1) \frac{S_S(n)}{\alpha} - \sum_{k=1}^{n} \beta^{n-k} k x(k) \right]$$

which ends the proof.

The least-squares equations therefore imply the relationships $$\frac{1}{\alpha} \hat{b}_1(n) + \frac{\alpha n - \beta}{\alpha^2} \hat{b}_2(n) = \frac{1}{\alpha} S_S(n) \quad (25)$$

$$\frac{\alpha n - \beta}{\alpha^2} \hat{b}_1(n) + \frac{(n+1)^2 \beta^2 - 2(n+1)n\beta + n^2 + \beta}{\alpha^3} \hat{b}_2(n) = \quad (26)$$

$$\frac{n+1}{\alpha} S_S(n) - \frac{1}{\alpha^2} S_D(n)$$

Solving these equations, we obtain $$\hat{b}_2(n) = \frac{\alpha}{\beta}[S_S(n) - S_D(n)] \quad (27)$$

$$\hat{b}_1(n) = S_S(n) + \left( \frac{\beta}{\alpha} - n \right) \hat{b}_2(n) \quad (28)$$

The described method can be used to analyze the timestamp errors in order to provide estimates of the frequency offset $\Delta f(n) = \hat{b}_2(n)$. We can see that this clock synchronization algorithm is very efficient computationally, and requires the storage of only a small number of clock samples. Recall that the receiver (PLL) initializes it counter value to the first arriving transmitter timestamp, i.e., $R(0) = S(0)$. Then when the PLL receives a new timestamp $S(i)$ it compares this with the local timestamp $R(i)$ to generate an error signal $x(i) = T_e(i) = S(i) - R(i)$. The computed frequency offset $\hat{b}_2(n)$ is used to estimate the receiver frequency as $f_r(n) = f_r(n-1) + \hat{b}_2(n)$.

As shown in FIG. 3, down-sampling can be introduced in the clock synchronization scheme by setting K>1, that is, the receiver processes every other Kth arriving transmitter timestamp instead of every arriving timestamp. In communication and other circuits, it is often necessary to produce an accurate reference signal whose frequency and phase can be precisely controlled in real time. Digitally controlled oscillators (DCOs), alternatively called here frequency synthesizer, are suited for this purpose. The term "frequency synthesizer" defines an active electronic device that accepts an input reference frequency and then generates one or more new ones as commanded by a control word, whereby the stability, accuracy, and spectral purity of the output correlates with the performance of the input reference. Unlike traditional phase-locked loop synthesis, all frequencies are generated as digital representations of the desired signal by means of digital sampling techniques. The approach inherently affords great flexibility to the designer in terms of control and accuracy of the target frequency since the DCO chip contains all the digital processing to construct and manipulate a frequency, most analog circuitry is eliminated, along with bothersome analog tolerances and aging effects. The function of the DCO is similar to that of a voltage controlled oscillator (VCO) in an analog phase locked loop (PLL). The VCO output frequency is a function of its input voltage, which is proportional to the phase error signal. In the digital PLL with a DCO, the time period of the DCO is controlled directly. The output of the loop filter in the form of a correction (or control) word, is used to control the period of the DCO in such a way as to decrease the error signal generated by the phase detector.

Figure 5:
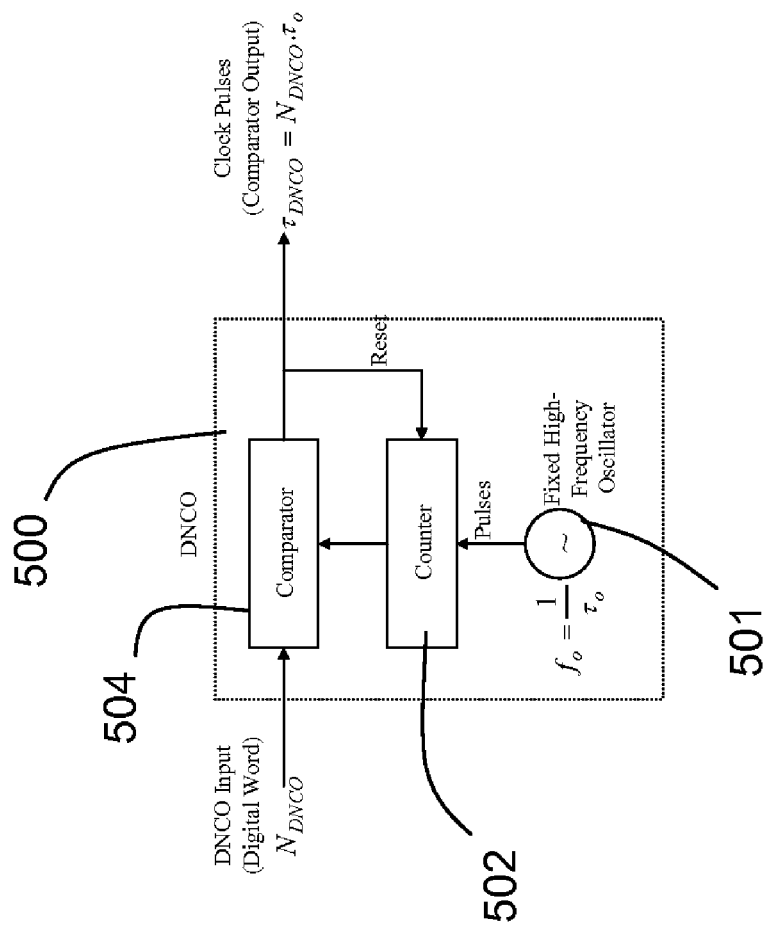
FIG. 5 illustrates a Divide-by-N counter oscillator (DNCO).
Figure 6:
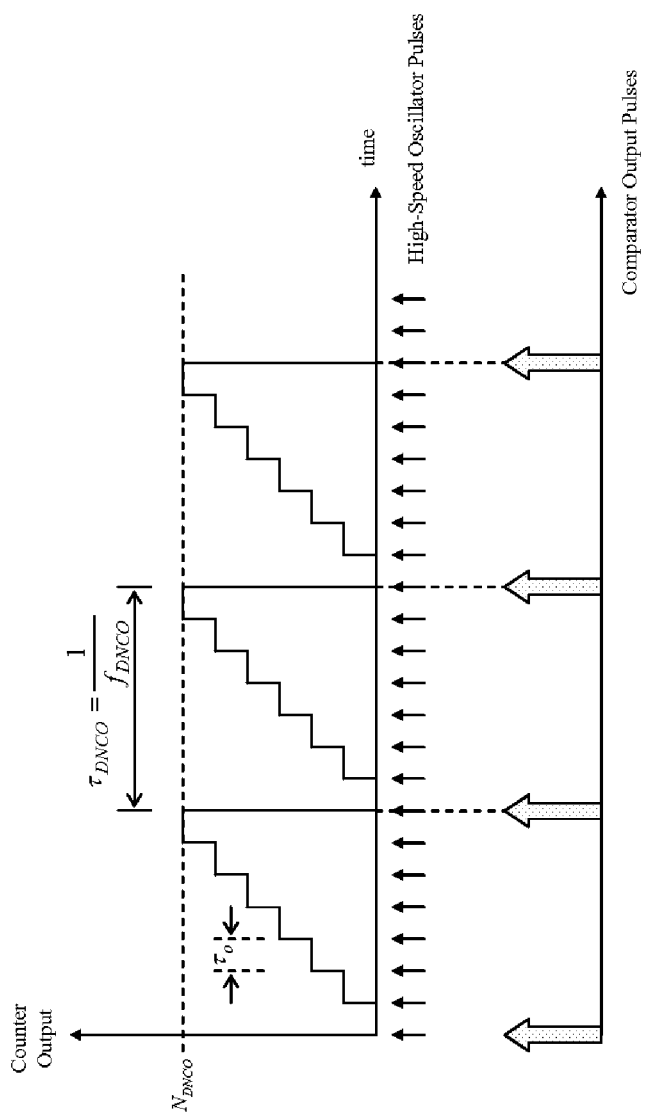
FIG. 6 illustrates operation of the DNCO.

The DCOs may be a divide-by-N counter type oscillator ("DNCO") or a direct digital synthesizer ("DDS"). FIGS. 5 and 6 show an example functional block diagram of a DNCO (500) as the oscillator (122, FIG. 1) and its operation. The DNCO functions as a programmable divide-by-N counter. The output of a stable high-speed oscillator (501) is used to drive a counter (502) which increases by one every clock cycle. The high-speed oscillator usually has a frequency, $f_o$, equal to $N_{nom}$ times the nominal frequency, $f_{nom} = 1/\tau_{nom}$, where $N_{nom}$ determines the number of quantization levels and the phase error resolution over $2\pi$. A comparator (504) compares the content of the counter with the control input value $N_{DNCO}$ and when they match, outputs a pulse which serves both as the DNCO output and a reset signal for the counter. Thus, the period of the counter output (the time between reset pulses) is proportional to $N_{DNCO}$. By varying the control input $N_{DNCO}$ the DNCO period can be controlled.

Figure 7:
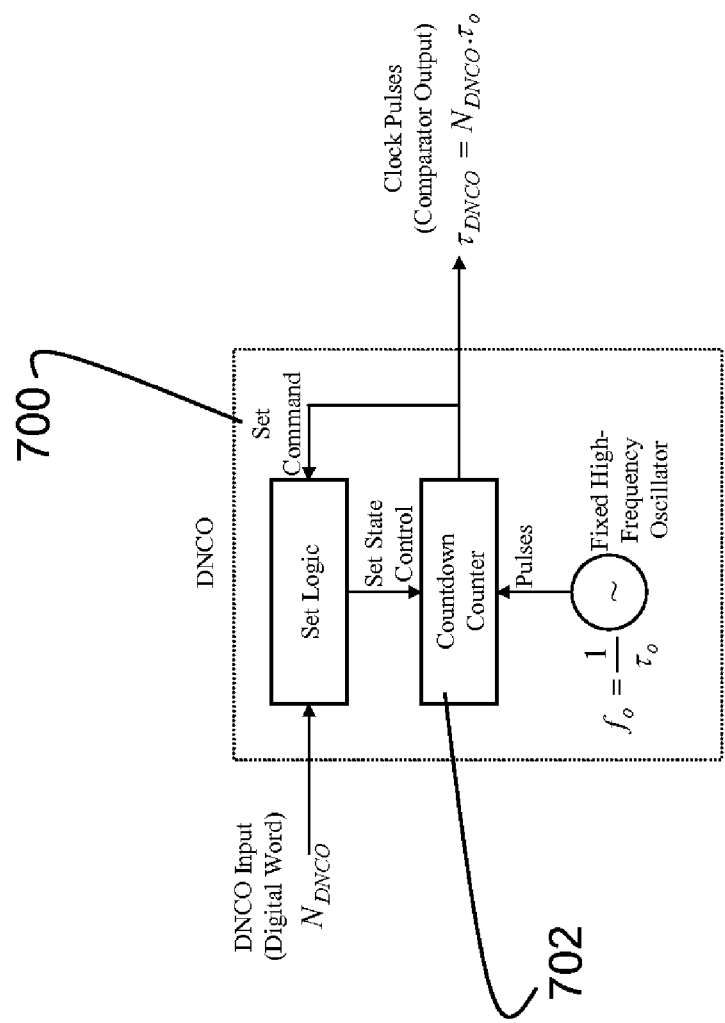
FIG. 7 illustrates an alternative embodiment of the DNCO.

An alternative DNCO (700) is shown in FIG. 7. The countdown counter (702) is preset to count $N_{DNCO}$ and counts down to zero. Upon hitting the zero state, an output clock pulse is generated and the countdown counter is reset to $N_{DNCO}$ for the beginning of the next period. This approach may be preferable as opposed to the implementation in a with the up-counter because the delay in recognizing the zero state is constant for any count.

Figure 8:
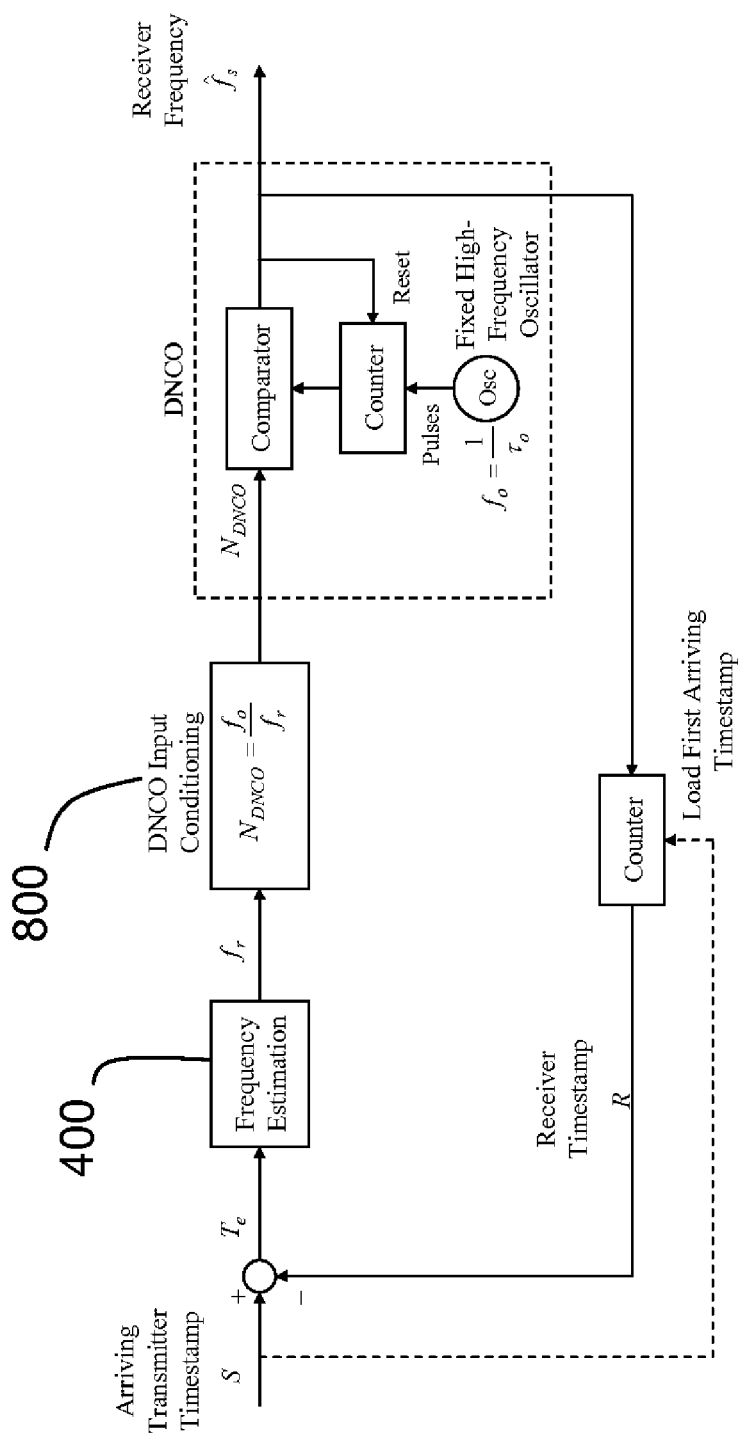
FIG. 8 illustrates a receiver PLL implementation using a DNCO.

As illustrated in FIG. 8, the output of the frequency estimation algorithm (400) is used to control the period of the DNCO in such a way as to decrease the error signal $T_e(i)$. The DNCO input is conditioned by process (800) as $$N_{DNCO}(n) = \frac{f_o}{f_r(n)}, \quad (29)$$

where $f_o$ is the frequency of the DNCO oscillator. For small quantization errors, we require that $f_o \gg f_{nom}$.

Figure 9:
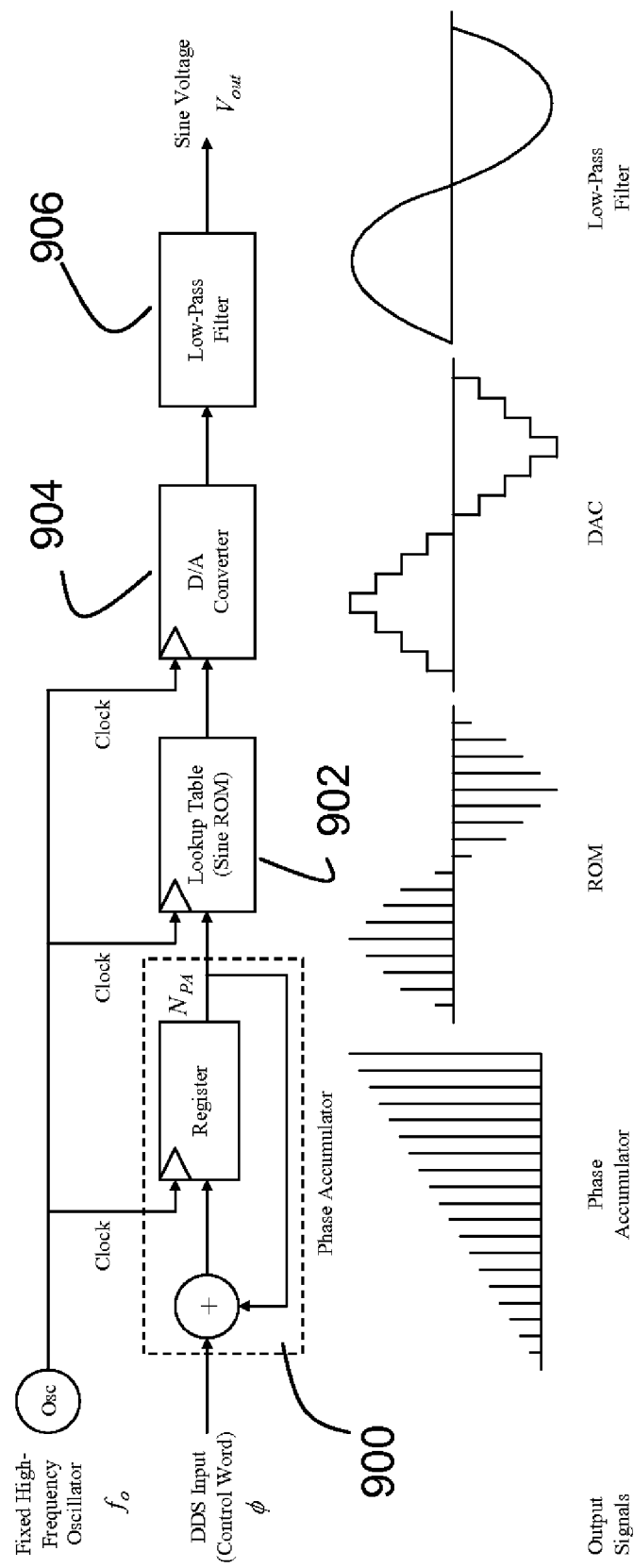
FIG. 9 illustrates an embodiment utilizing a Direct Digital Synthesizer ("DDS").

FIG. 9 illustrates an embodiment utilizing a Direct Digital Synthesizer ("DDS"). Direct digital synthesis can easily be explained from a linear approximation of the phase of the sine function. Sine waves are typically thought of in terms of their amplitude form. Let us consider the following waves with unit amplitude $$x(t)=\sin(\omega t), \quad (30)$$

or $$x(t)=\cos(\omega t). \quad (31)$$

However, these are nonlinear and not easy to generate except through piece-wise construction. On the other hand, the angular information (phase angle) is linear in nature. That is, the phase angle rotates through a fixed angle for each unit of time. The angular rate depends on the frequency f of the signal by the traditional rate of $\omega=2\pi f$. Knowing that the phase of a sine wave is linear and given a reference interval (clock period), $\delta t=1/f_o$, the phase rotation for that period can be determined as $$\phi=\Delta\theta=\omega\delta t. \quad (32)$$

Solving for the angular rate $\omega$ we obtain $$\omega = \frac{\phi}{\delta t} = 2\pi f. \quad (33)$$

Then solving for the frequency f, we get $$f = \frac{\phi}{2\pi\delta t}. \quad (34)$$

Now, knowing that the reference clock frequency corresponding to the time increment $\delta t$ is $f_o=1/\delta t$, we get $$f = \frac{\phi \cdot f_o}{2\pi}. \quad (35)$$

Direct digital synthesis is based upon this fundamental equation.

Though there are many variations, the conventional DDS architecture can be viewed as a simple assembly comprised of only three common digital components: a phase accumulator (or adder/accumulator) (900), a mapping device (902) (such as a read-only-memory (ROM) or random-access memory (RAM)), and a digital-to-analog (DAC) (904). In many cases a low-pass filter (906) is implemented at the output of the DAC but this component is not normally considered a part of the DDS. The reference clock $f_o=1/\delta t$ must operate at higher frequency than the synthesized clock because of Nyquist theorem.

The phase accumulator generates the phase component of the output clock. It is implemented as a q-bit adder, with two inputs; the phase increment word $\phi=\Delta\theta$ and the previous sum. The range of phase numbers $2^q$ is spread across one cycle of the sine wave, thus we make $2\pi=2^q$. Substituting this into (14), we get the generated output frequency as $$f_{DDS} = \frac{\phi \cdot f_o}{2^q}. \quad (36)$$

The phase accumulator represents a cyclic phase generator producing a time series of binary integer values (phase sequence) corresponding to the oscillator progression of phase. The phase sequence is generated by a q-bit accumulator clocked at the sample rate, $f_o=1/\delta t$, which accumulates a phase increment, $\phi$, modulo $2^q$.

Figure 10:
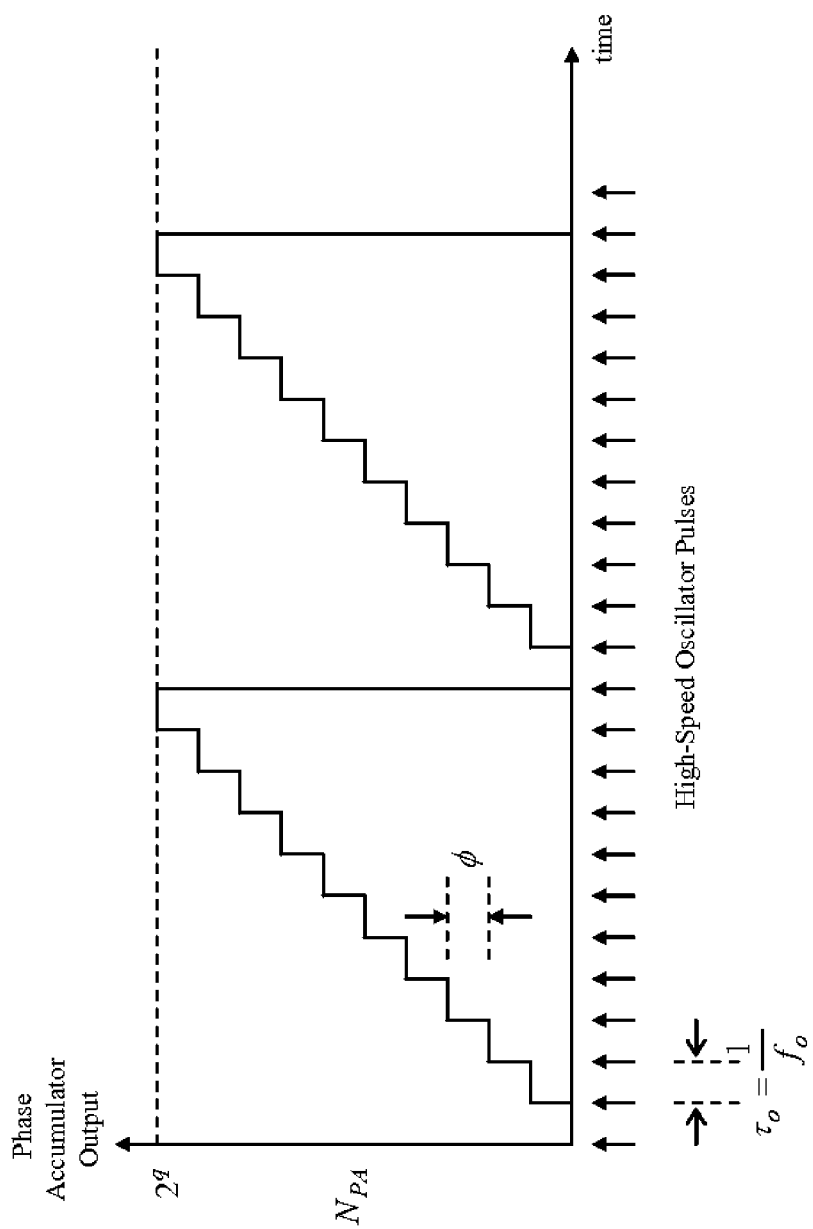
FIG. 10 illustrates phase accumulator output.

As shown in FIG. 10, the phase accumulator is capable of repeatedly adding a programmable binary phase input value $\phi$ to the content of the accumulator. This is equivalent to performing the following mathematical integration $$N_{PA}(n\delta t)=[N_{PA}(n\delta t-\delta t)+\phi]\text{modulo } 2^q, \quad (37)$$

where $N_{PA}(n\delta t)$ is the content of the phase register (represents DDS phase in fractional cycles), and n is the time index, and $\delta t$ is the sampling interval. The value of $N_{PA}(n\delta t)$ is bounded by the width (number of bits) of the input $\phi$ and of the accumulator (q number of bits). Note that a cycle is equal to $2^q$, so $N_{PA}(n\delta t)$ is always modulo $2^q$. $N_{PA}(0)$ represents the accumulator initial condition at n=0, which can take a value of zero or higher value to produce an initial phase shift. The complete set of discrete states generated by the accumulator may be evenly mapped as phase values around a circle. This would correspond to the discrete output waveform values. The restriction imposed on the phase accumulator by the finite width results in an overflow inherent in the binary adder. This implies a phase zero crossing upon overflow. The frequency of overflow may be reduced by increasing the width of the binary adder. From this we see that the DDS phase output in radians is $$\theta_{PA} = \frac{2\pi}{2^q} N_{PA}(n\delta t). \quad (38)$$

This means the DDS divides the range of the input signal $(0,2\pi)$ into $2^q$ equal increments. The stored value in the accumulator represents the current phase of a cyclical function. The input to the phase accumulator is the frequency control word $\phi$. Since this word represents a q-bit digital value, the output frequency of the DDS $f_{DDS}$ is changed by variation of the input control word. The above phase accumulator arrangement constitutes a frequency generator at a fixed rate for given values of $\phi$ and $f_o=1/\delta t$.

Once the phase information is generated, it must be converted to a sinusoidal value. The lookup table stores samples of a sinusoid. The phase accumulator is used to generate a suitable phase argument that is mapped by the lookup table to the desired output waveform. Thus, the second component in a DDS is a memory or mapping device that performs the nonlinear transformation of $\omega t \Rightarrow \sin(\omega t)$.

The size of the phase increment determines the actual output frequency. The binary width of the phase accumulator (accumulator overflows) determines the minimum frequency, which is equal to the frequency step, achievable by the DDS. The frequency increment (or resolution) of a DDS is defined as $$\delta f_{DDS} = \frac{f_o}{2^q}. \quad (39)$$

The frequency resolution of the DDS is a function of the clock frequency $f_o$ and the number of bits q employed in the phase accumulator. Clearly, the wider the phase accumulator is the finer frequency tuning step we can get. The phase accumulator must have a sufficient field width to span the desired frequency resolution. For practical applications, a large number of bits are allocated to the phase accumulator in order to satisfy the system frequency resolution requirements.

Given the resolution $\delta f_{DDS}$ and the clock frequency, the required number of bits is given as:

$$q = \log_2\left[\frac{f_o}{\delta f_{DDS}}\right]. \tag{40}$$

Given that there is a direct mapping of phase to amplitude, a ROM/RAM lookup table can be used to convert the phase values. The phase accumulator generates a discrete time phase sequence $N_{PA}(n\delta t)$, which is then mapped to the amplitude domain using a lookup table containing a single sinusoid. The digitized phase mapping from the phase accumulator is used to address the ROM/RAM which contains the stored values of the desired output waveforms.

Figure 11:
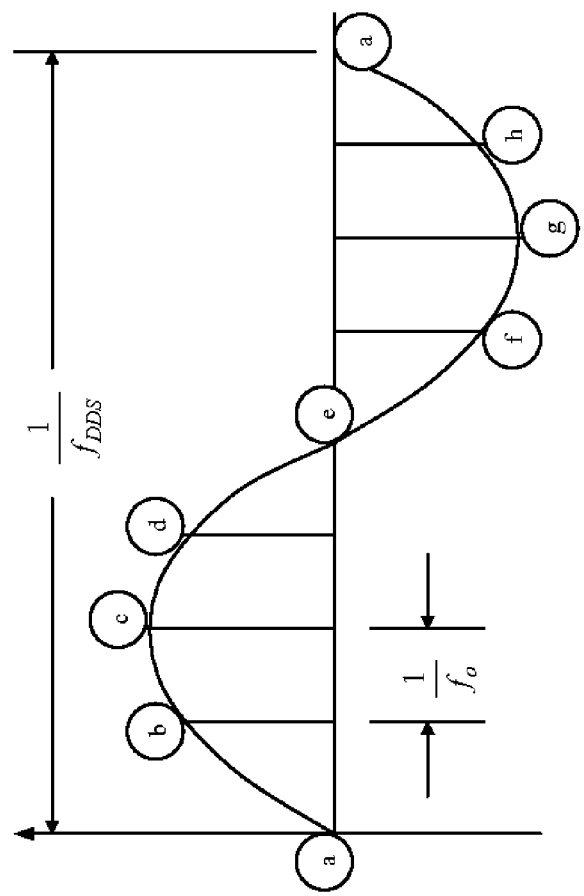
FIG. 11 illustrates phase accumulation of a sample sine wave.
Figure 11:
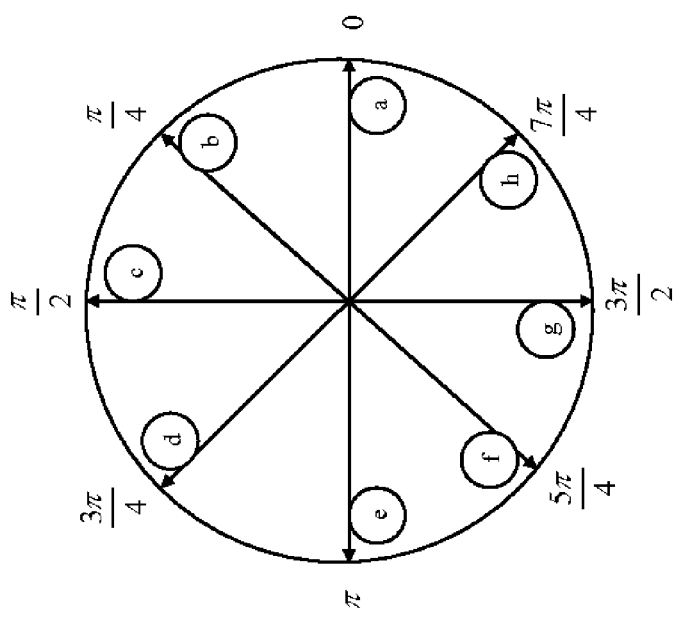

FIG. 11 shows that phase accumulation of a generated sine wave whose frequency is equal to ⅛ of the clock frequency. The circle shows the phase accumulation process of $\pi/4$ at each clock cycle. The dots on the circle represent the phase value at a given time and the sine wave shows the corresponding amplitude representation. This phase to amplitude conversion occurs in the sine lookup table. Note that the phase increment added during each clock period is $\pi/4$ radians, which is equal to ⅛ of $2\pi$. The phase value stored in an input frequency register is added to the value in the phase accumulator once each period of the system clock. The resulting phase value (from 0 to $2\pi$) is then applied to the sine lookup once during each clock cycle. The lookup converts the phase information to its corresponding sine amplitude.

If an analog output is required, the DDS presents the digital samples from the lookup table to a DAC and a low-pass filter to obtain an analog waveform with the specific frequency structure. Of course, the samples are also commonly used directly in the digital domain. The function of the DAC (paired with the low-pass filter) is to reconstruct the discrete waveform. The DAC is required to transform the digital sine information into the analog domain. The DAC converts the output values from the ROM/RAM lookup table (i.e., the digital amplitude information) into analog output $V_{out}(t)$. A high speed DAC is used to make this conversion. Resolution of the DAC determines the quality of the output waveform.

Referring again to FIG. 9, each digitized sine wave output from the DDS is converted to an analog waveform by a DAC. The output of the DAC has the desired sine wave as a major component, but also includes the higher frequency image components due to the conversion of a sampled waveform. A Low-Pass Filter (LPF) is used to reduce these image signals to the desired level. There can be additional degradation of the output waveform related to both harmonics of the frequency being generated and the clock rate of the DAC. Non-ideal behavior of the DAC will introduce distortion that shows up as harmonic spurs. Slow edge rates or delay mismatch on the signals switching the current or settling time, over/under shoot, and glitch impulses at the DAC output can lead to this harmonic distortion. When operating well below Nyquist, these harmonics appear directly in the pass band and usually can be handled with appropriate filter at the output. However, when generating frequencies that approach Nyquist, these harmonics can mix with the reference clock and can produce spurs that fall back onto or near the fundamental (this phenomenon is known as aliasing).

Figure 12:
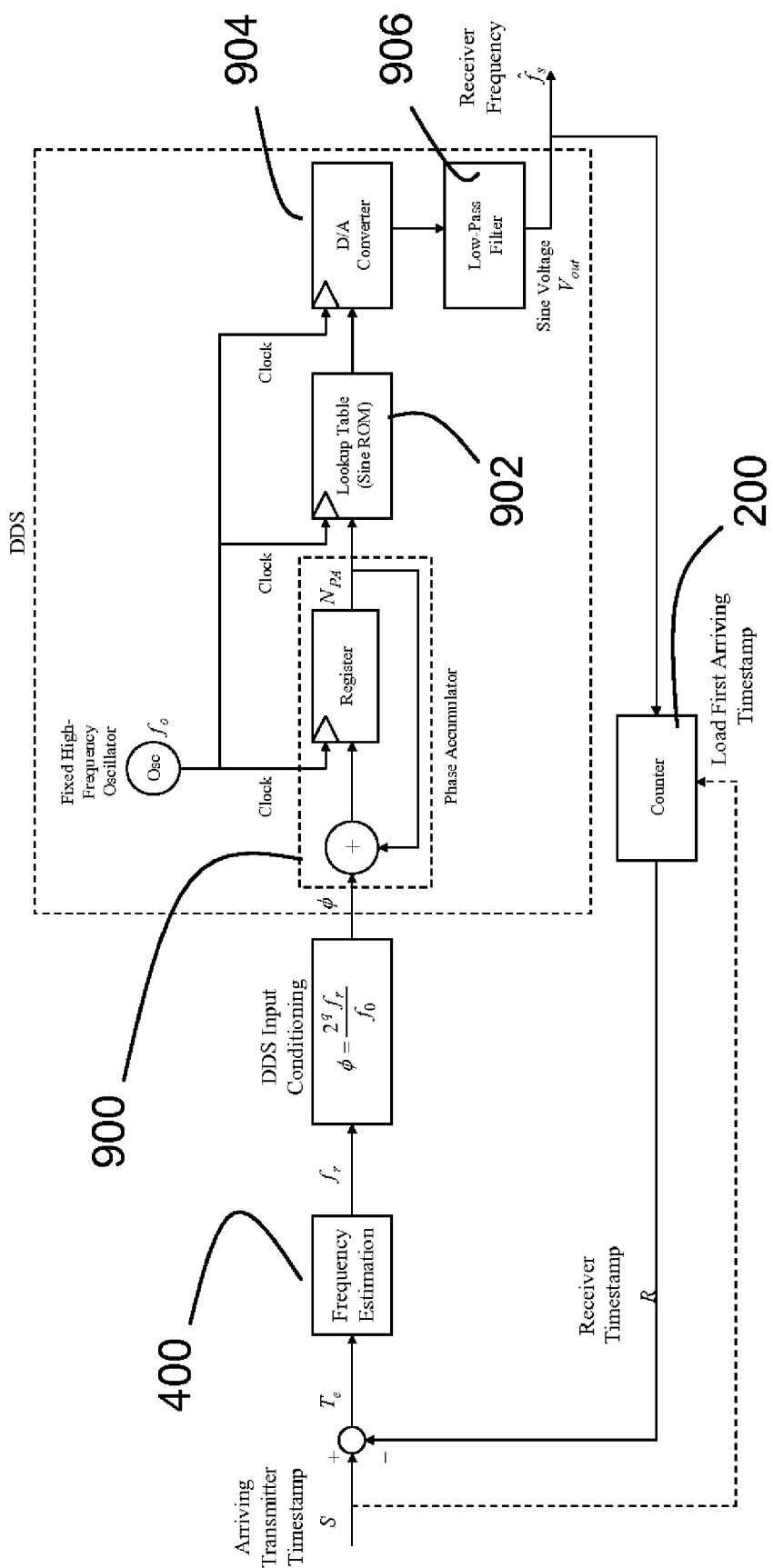
FIG. 12 illustrates a receiver PLL implementation using a DDS.

Referring to FIG. 12, the phase accumulator (900) is a variable-modulus counter that increments the number stored in it each time it receives a clock pulse. When the counter overflows it wraps around, making the phase accumulator's output contiguous. The larger the added increment $\phi$, the faster the accumulator overflows, which results in a higher output frequency. The output frequency $f_{DDS}=f_r$ of the DDS waveform is a function of the system clock frequency $f_o$, the number of bits q in the phase accumulator and the phase increment value $\phi$. The phase increment value required to generate an output frequency $f_r(n)$ Hz is $$\phi(n) = \frac{2^q f_r(n)}{f_o}. \tag{41}$$

The phase increment $\phi(n)$ is an unsigned value. The phase increment term defines the DDS output frequency.

Figure 13:
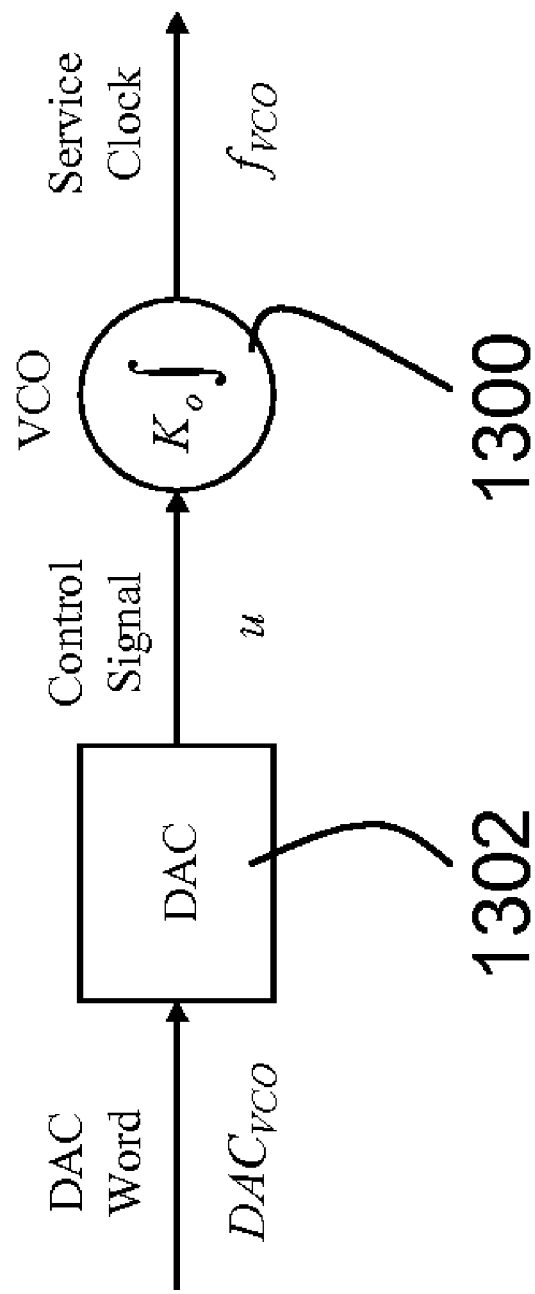
FIG. 13 illustrates a receiver PLL Implementation using a VCO.

FIG. 13 illustrates a Receiver PLL (112) implementation using a VCO (1300). The VCO oscillates at an angular frequency $\omega_{VCO}(n)$ which is determined by the input signal s(n). The angular frequency of the VCO $\omega_{VCO}(n)$ is given by $$\omega_{VCO}(n)=\omega_o+K_o s(n) \tag{42}$$

where $\omega_o=2\pi f_{nom}$ is the center angular frequency of the VCO (expressed in rad/sec), $K_o$ is the VCO gain. The deviation of the VCO from its center frequency is $\Delta\omega_{VCO}(n)=K_o s(n)$. In applications where the control signal for frequency control is digital, a Digital-to-Analog Converter (DAC) (1302) has to be implemented at the input to the VCO. A DAC is device for converting digital signals into continuous analog signals. The converter usually buffers the input so that the output remains the same until the input changes. The useful operating range of the VCO frequency-voltage characteristic curve is typically linear, as shown in FIG. 14.

Figure 14:
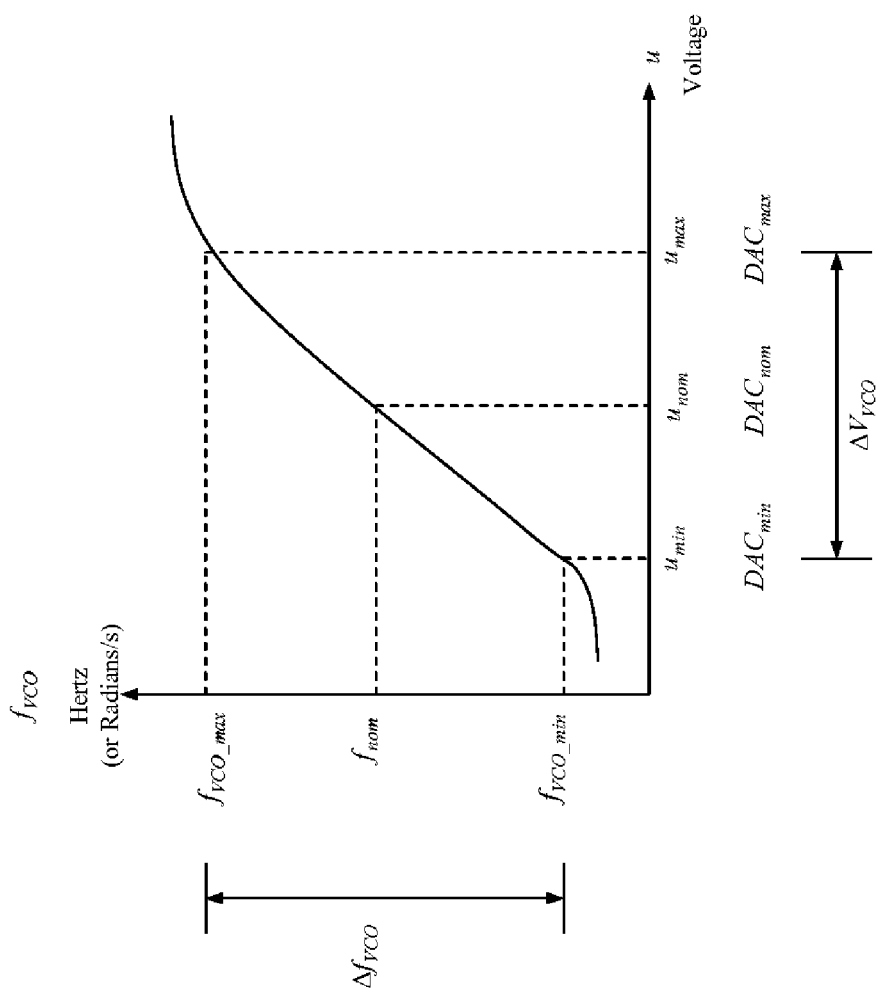
FIG. 14 illustrates a VCO characteristic curve.
Figure 15:
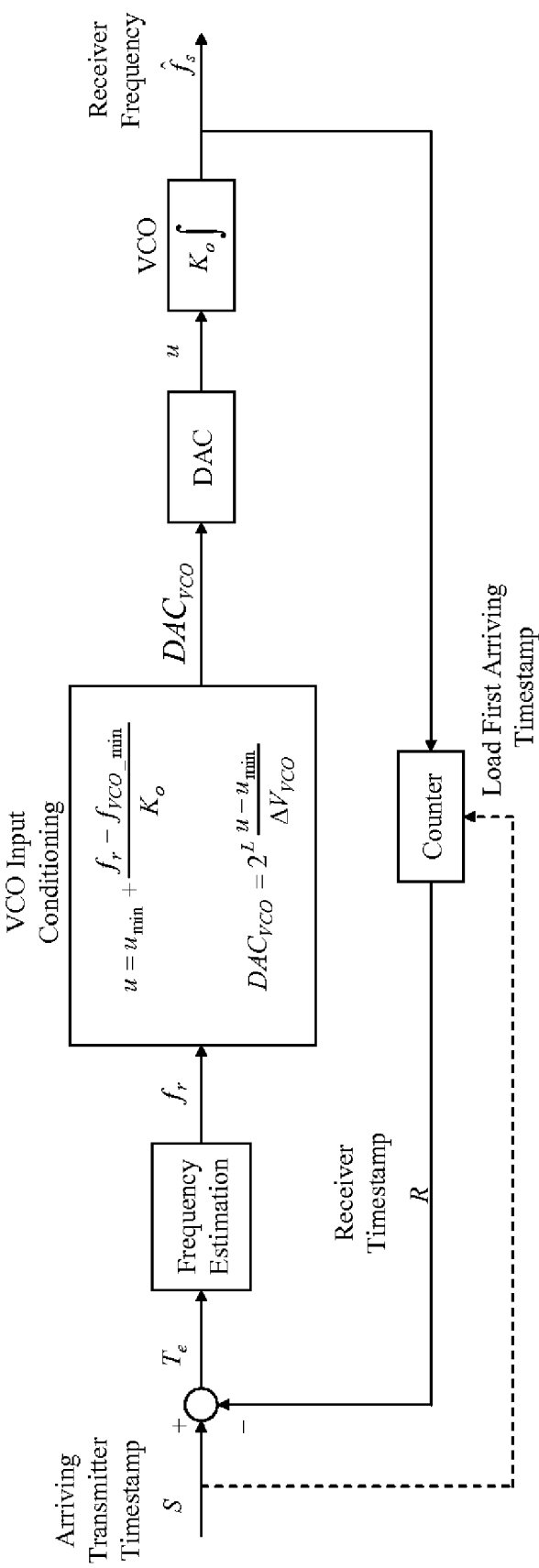
FIG. 15 illustrates an alternative receiver PLL implementation using a VCO.

Referring to FIGS. 14 and 15, the VCO characteristic curve can be stored as a lookup table mapping DAC input to VCO output frequency. It can also be represented by a set of piecewise linear curves each capturing a linear segment of the VCO characteristic curve, each segment with its associated slope. The parameters and components of the VCO can be specified given its frequency range. The first requirement is the determination of the supply voltage(s) of the VCO (alternatively this can be determined from the data sheet of the VCO supplier). For example, the VCO circuit can be powered from a unipolar +5V supply. Let the VCO supply voltage be denoted by $U_{supply}$. The VCO control signal u is usually limited to a range which is smaller than the supply voltage $U_{supply}$. Let $u_{min}$ and $u_{max}$ be the minimum and maximum value allowed for u, respectively. The VCO is required to generate the frequency $f_{VCO\_min}$ when $u=u_{min}$, and the frequency $f_{VCO\_max}$ when $u=u_{max}$. The angular frequency is determined at $u=U_{supply}/2$ which corresponds to a frequency $\omega_o$ that is considered as the center frequency of the PLL (irrespective of the fact that the center frequency could be varying (e.g., due to temperature effects, aging)). Let us assume the VCO characteristic curve can be represented by one linear curve. The slope of the linear curve, (which is proportional to VCO gain) can be calculated as:

$$K_o = \frac{f_{VCO\_max} - f_{VCO\_min}}{u_{max} - u_{min}}. \tag{43}$$

Given a VCO input voltage u, the equation for the linear approximation of the VCO characteristic curve can then be written as $$f_{VCO}=f_{VCO\_min}+K_o(u-u_{min}) \tag{44}$$

Now an output frequency of $f_r(n)$ determined by the frequency estimation algorithm will correspond to the following VCO input voltage $$u(n) = u_{min} + \frac{f_r(n) - f_{VCO\_min}}{K_o} \quad (45)$$

The VCO input voltage $u(n)$ in turn maps to the following DAC input value for a L-bit DAC where $[DAC_{min}, DAC_{max}]$ corresponding to $[0, 2^L/1]$ $$DAC_{VCO}(n) = 2^L \frac{u(n) - u_{min}}{u_{max} - u_{min}} \quad (46)$$
$$= 2^L \frac{u(n) - u_{min}}{\Delta V_{VCO}}$$

In PLL design, a current-controlled oscillator (CCO) can be used instead of the VCO. In this case, the output signal of the DAC is a controlled current source rather than a voltage source. However, the operating principle of the receiver PLL remains the same.

Figure 16:
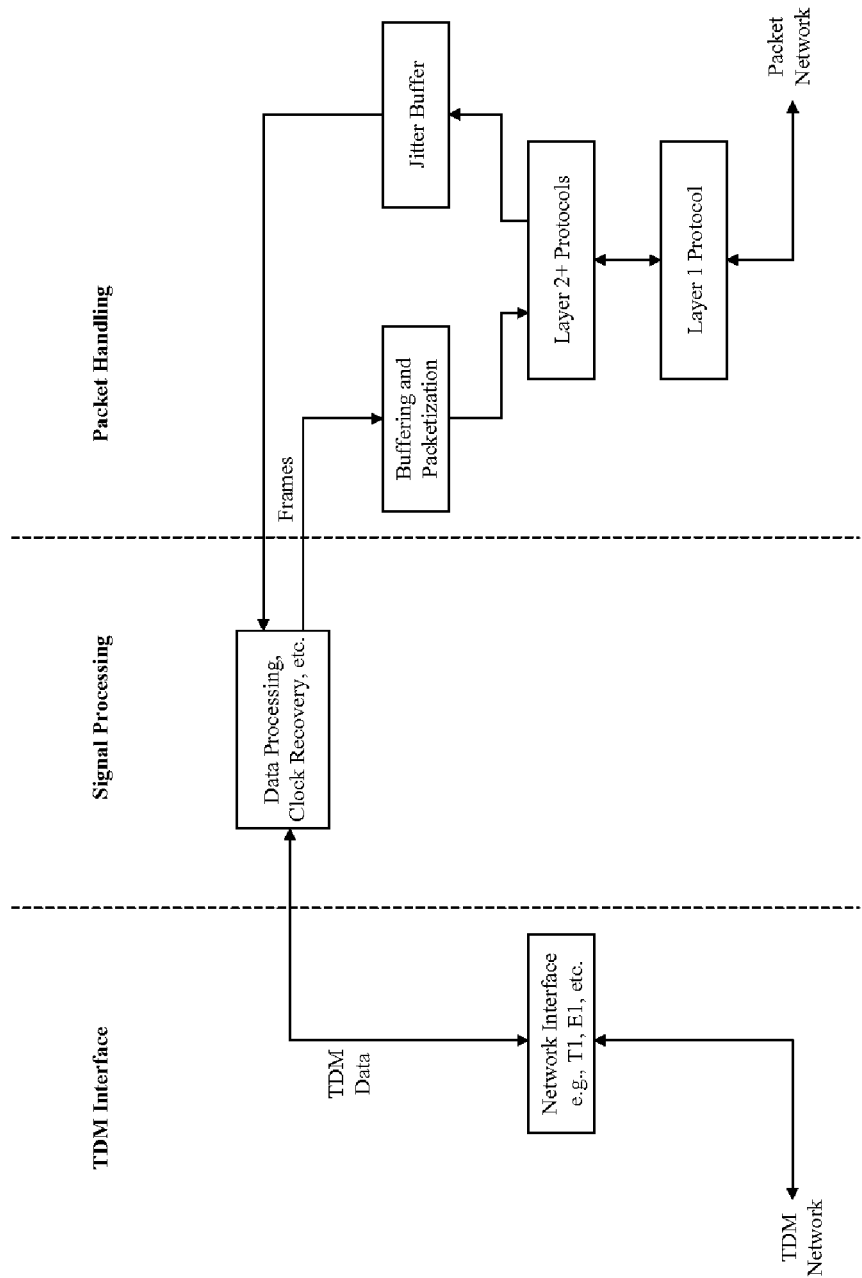
FIG. 16 illustrates an exemplary application of clock synchronization technique.

FIG. 16 shows an example application of the clock synchronization scheme in an interworking unit ("IWU") that supports the transport of TDM data over packet networks. The TDM network interface in the IWU includes any hardware or software that connects the IWU to the TDM network. Other functions in the IWU include the clock recovery mechanism, buffering and packetization functions, jitter buffers, and all the necessary networking protocols for interworking with the packet network. The recovered clock frequency at the receiver (i.e., packet-to-TDM IWU) that drives the receiver counter can also be used for data playout purposes.

Figure 17:
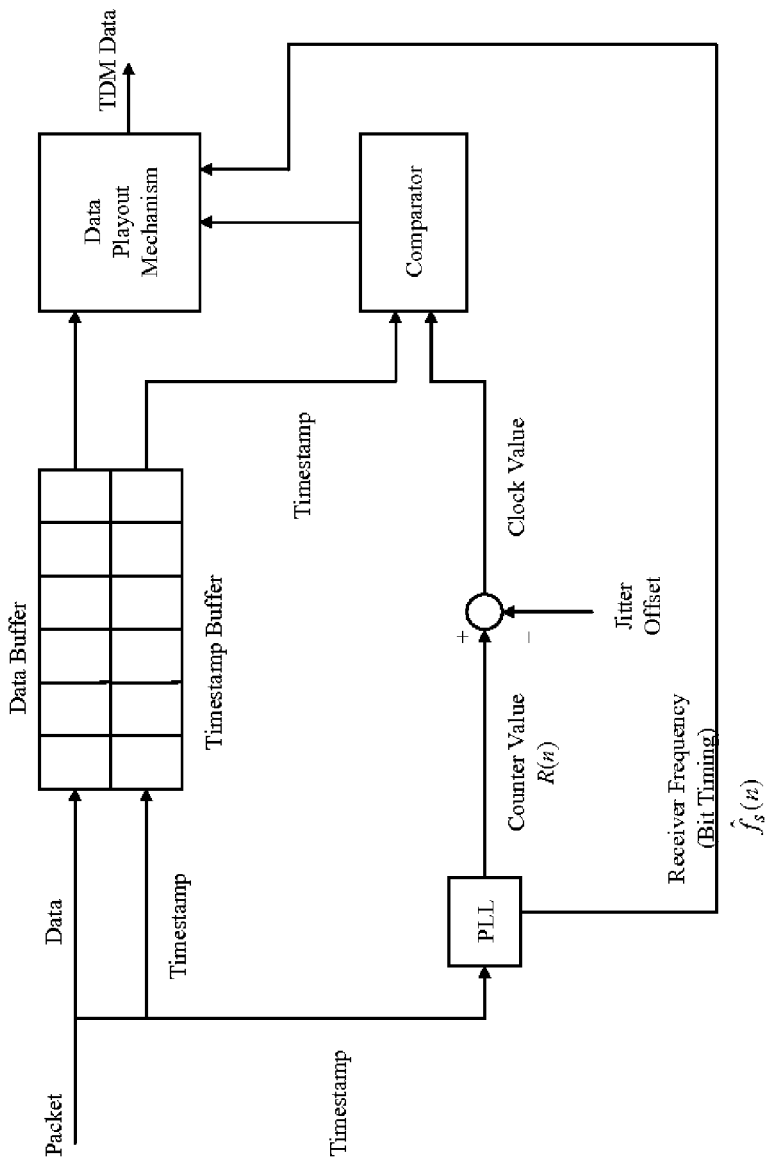
FIG. 17 illustrates payload playout at the receiver using recovered clock.

Referring to FIG. 17, the playout process using the recovered clock signal and the PLL counter value R(i) can be described as follows. For each data packet (carrying a timestamp) that arrives from the packet network, the timestamp S(i) is read and sent to the PLL, and then the data (i.e., packet payload) is placed in the receiver data buffer. A copy of the timestamp is also stored in a timestamp buffer. The monotonically increasing clock signal (counter value) R(i) minus a jitter offset θ is periodically compared with the stored timestamps. When equal to a timestamp, the associated payload of the packet is sent to the receiving application at the time indicated by the timestamp. The jitter offset should account for the maximum jitter amplitude and packet loss rate that is allowed in the system. The size of the receiver buffer can be at least the size of the statistical bound of the delay variations.

While the invention is described through the above exemplary embodiments, it will be understood by those of ordinary skill in the art that modification to and variation of the illustrated embodiments may be made without departing from the inventive concepts herein disclosed. Moreover, while the preferred embodiments are described in connection with various illustrative structures, one skilled in the art will recognize that the system may be embodied using a variety of specific structures. Accordingly, the invention should not be viewed as limited except by the scope and spirit of the appended claims.

What is claimed is:

1. An apparatus for synchronizing a local clock at a receiver with a local clock at a transmitter, where indications of transmitter clock signals are communicated to the receiver as timestamps, the apparatus comprising:

a phase detector operable to compute an error signal indicative of differences between the timestamps and a local clock signal;

a loop filter operable to estimate a frequency offset of the receiver clock with respect to the transmitter clock by weighted least-squares calculation, and thereby produce an estimate of the receiver frequency, the weighted least-squares calculation including calculating a first order finite difference function of a past frequency estimate and an offset value, the offset value based on first and second order finite difference equations;

a control signal produced by scaling an estimated frequency by a factor dependent on a receiver oscillator characteristics;

a digital oscillator operable to oscillate at a frequency based at least in-part on the control signal, and thereby produce a digital oscillator output signal; and a counter operable to receive the digital oscillator output signal and to count pulses in the digital oscillator output signal, and output the local clock signal.

2. The apparatus of claim 1, wherein the weighted least squares calculation includes adding the frequency offset to a previous frequency estimation value.

3. The apparatus of claim 1, wherein the weighted least squares calculation includes a first order finite difference function of estimated frequency.

4. A method for synchronizing a local clock at a receiver with a clock at a transmitter, where indications of transmitter clock signals are communicated to the receiver as timestamps, the method comprising:

computing, with a phase detector, an error signal indicative of differences between the timestamps and a local clock signal;

estimating, with a loop filter, a frequency offset of the receiver clock with respect to the transmitter clock by weighted least-squares calculation, thereby producing an estimate of the receiver frequency, the weighted least-squares calculation including calculating a first order finite difference function of a past frequency estimate and an offset value, the offset value based on first and second order finite difference equations;

scaling the estimated frequency by a factor dependent on a receiver oscillator characteristics, thereby producing a control signal;

producing a digital oscillator output signal with a digital oscillator operable to oscillate at a frequency based at least in-part on the control signal; and counting pulses in the digital oscillator output signal with a timestamp counter, thereby producing the local clock signal.

5. The method of claim 4 wherein the loop filter includes a low-pass filter.

6. The method of claim 4 wherein the digital oscillator includes a divide-by-N counter oscillator (DNCO).

7. The method of claim 6 wherein the frequency scaling factor is proportional to the frequency of the high frequency oscillator of the DNCO.

8. The method of claim 4 wherein the digital oscillator includes a direct digital synthesizer (DDS).

9. The method of claim 8 wherein the frequency scaling factor is proportional to the bit size of the DDS phase accumulator and inversely proportional to the frequency of the sampling oscillator of the DDS.

10. The method of claim 8 wherein the direct digital synthesizer includes a phase accumulator, and including the further step of generating a phase component of the local clock signal with the phase accumulator.

11. The method of claim 9 where in the direct digital synthesizer includes a mapping device, and including the further step of maintaining samples of sinusoid indexed by the output of the phase accumulator.

12. The method of claim 11 wherein the digital synthesizer includes a digital to analog converter, and including the further step of producing an analog output signal based at least in-part on the of the mapping device with the digital to analog converter.

13. The method of claim 12 wherein the digital synthesizer includes a low-pass filter, and including the further step of producing an output signal based at least in-part on the output of the digital to analog converter with the low-pass filter.

14. An apparatus for synchronizing a receiver clock to a transmitter clock based on time stamps transmitted by the transmitter, the apparatus comprising:
- a phase detector to determine an error signal based on a difference between a received time stamp and a local clock signal;
- a frequency estimator to estimate a frequency based on the error signal, the estimate based on a weighted least-squares calculation, the weighted least-squares calculation including calculating a first order finite difference function of a past frequency estimate and an offset value, the offset value based on first and second order finite difference equations;
- a direct digital synthesizer to produce a digital oscillator output signal, the direct digital synthesizer comprising a phase accumulator to output a phase argument and a look up table to convert the phase argument to a discrete sinusoidal value; and
- a counter operable to count pulses in the digital oscillator output signal and to output the local clock signal.

15. The apparatus of claim 14, further comprising an analog to digital converter, the analog to digital converter converting the discrete sinusoidal values to a sine wave approximation.

16. The apparatus of claim 15, further comprising a low pass filter, the low pass filter converting the sine wave approximation to a sine wave.

17. The apparatus of claim 14, wherein the phase accumulator has a phase resolution that divides a period of zero to $2\pi$ into $2^q$ intervals, q being the number of bits of the phase accumulator output.

18. The apparatus of claim 14, wherein the phase accumulator includes a register that is clocked by a high frequency oscillator.

19. The apparatus of claim 18, wherein a frequency resolution of the phase accumulator is based on a frequency of the high frequency oscillator and a number of bits of the phase accumulator output.

20. The apparatus of claim 14, further comprising an input conditioner, the input conditioner receiving the frequency estimation and outputting a phase value to the direct digital synthesizer based on the frequency estimation.

21. The apparatus of claim 14, wherein the weighted least squares calculation includes a single exponential filtering function.

* * * * *